United States Patent
Yu et al.

(10) Patent No.: US 7,999,172 B2
(45) Date of Patent: Aug. 16, 2011

(54) FLEXIBLE THERMOELECTRIC DEVICE

(75) Inventors: Chih-Kuang Yu, Chiayi (TW); Chun-Kai Liu, Taipei (TW); Ming-Ji Dai, Chiayi County (TW)

(73) Assignee: Industrial Technology Research Institute, Hsinchu (TW)

( * ) Notice: Subject to any disclaimer, the term of this patent is extended or adjusted under 35 U.S.C. 154(b) by 302 days.

(21) Appl. No.: 11/964,712

(22) Filed: Dec. 27, 2007

(65) Prior Publication Data
US 2009/0014046 A1    Jan. 15, 2009

(30) Foreign Application Priority Data
Jul. 12, 2007   (TW) ................................. 96125383 A

(51) Int. Cl.
*H01L 35/02* (2006.01)
*B29C 43/02* (2006.01)

(52) U.S. Cl. ........ 136/205; 136/203; 136/225; 136/230; 62/3.3; 62/3.2

(58) Field of Classification Search .................. 136/205, 136/203, 225, 230; 62/3.2, 3.3
See application file for complete search history.

(56) References Cited

U.S. PATENT DOCUMENTS

| | | | |
|---|---|---|---|
| 3,819,418 A | 6/1974 | Winkler | |
| 4,468,557 A | 8/1984 | Bylin | |
| 4,497,973 A | 2/1985 | Heath | |
| 4,541,728 A | 9/1985 | Hauser | |
| 4,859,250 A | 8/1989 | Buist | |
| 5,022,928 A | 6/1991 | Buist | |
| 5,031,689 A | 7/1991 | Jones | |
| 5,724,818 A * | 3/1998 | Iwata et al. | 62/3.7 |
| 5,841,064 A * | 11/1998 | Maekawa et al. | 136/203 |
| 6,025,554 A * | 2/2000 | Macris | 136/205 |
| 6,096,964 A | 8/2000 | Ghamaty | |
| 6,096,965 A | 8/2000 | Ghamaty | |
| 6,096,966 A * | 8/2000 | Nishimoto et al. | 136/205 |
| 6,097,088 A | 8/2000 | Sakuragi | |
| 6,121,539 A * | 9/2000 | Johnson et al. | 136/203 |
| 6,262,357 B1 * | 7/2001 | Johnson et al. | 136/203 |
| 6,297,441 B1 * | 10/2001 | Macris | 136/201 |
| 6,314,741 B1 | 11/2001 | Hiraishi | |
| 6,410,971 B1 * | 6/2002 | Otey | 257/467 |
| 6,512,291 B2 | 1/2003 | Dautartas | |
| 6,548,750 B1 | 4/2003 | Picone | |
| 6,700,052 B2 | 3/2004 | Bell | |
| 6,823,678 B1 | 11/2004 | Li | |
| 6,893,902 B2 * | 5/2005 | Cordes et al. | 438/122 |
| 7,012,554 B2 | 3/2006 | Hiller | |
| 2002/0069609 A1 * | 6/2002 | Nees et al. | 52/735.1 |
| 2003/0029173 A1 * | 2/2003 | Bell et al. | 62/3.3 |
| 2003/0084935 A1 * | 5/2003 | Bell | 136/200 |
| 2006/0112982 A1 * | 6/2006 | Maruo et al. | 136/204 |
| 2007/0194465 A1 * | 8/2007 | Dai et al. | 257/794 |

* cited by examiner

*Primary Examiner* — Alexa D Neckel
*Assistant Examiner* — Golam Mowla
(74) *Attorney, Agent, or Firm* — Jianq Chyun IP Office

(57) ABSTRACT

A flexible thermoelectric device and a manufacturing method thereof are provided. Flexible substrates are formed by using LIGA process, micro-electro-mechanical process or electro-forming technique. The flexible substrates are used to produce thermoelectric device. The structure and the material property of the substrates offer flexible property and tensile property to the thermoelectric device. Thermal transfer enhancement structures such as thermal via or metal diffusion layer are formed on the flexible substrates to overcome the low thermal transfer property of the flexible substrates.

18 Claims, 9 Drawing Sheets

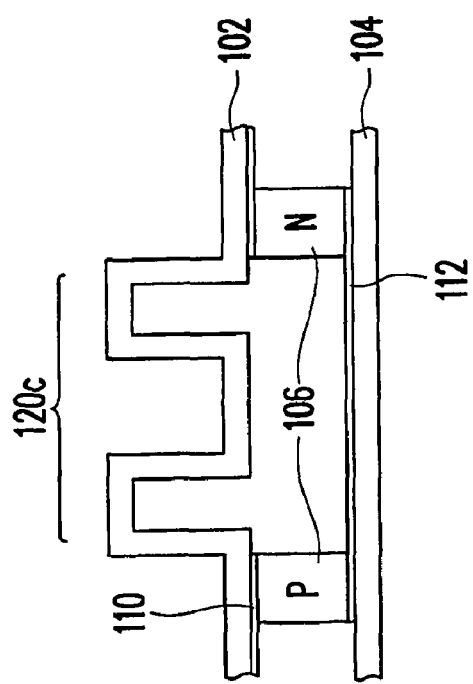
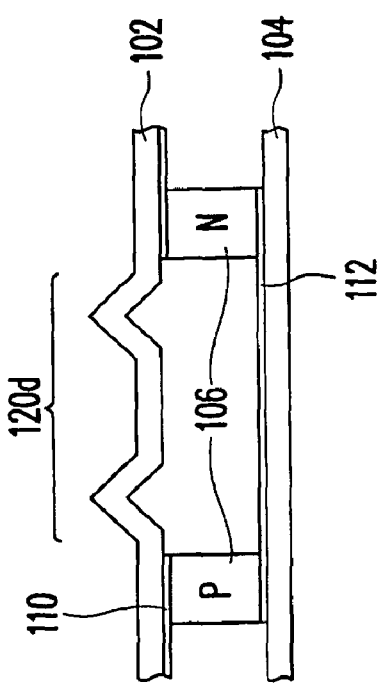

FLEXIBLE THERMOELECTRIC DEVICE

CROSS-REFERENCE TO RELATED APPLICATION

This application claims the priority benefit of Taiwan application serial no. 96125383, filed Jul. 12, 2007. The entirety of the above-mentioned patent application is hereby incorporated by reference herein and made a part of this specification.

BACKGROUND OF THE INVENTION

1. Field of the Invention

The present invention relates to a thermoelectric device. More particularly, the present invention relates to a flexible thermoelectric device and a manufacturing method thereof.

2. Description of Related Art

Thermoelectric devices produced by using thermoelectric semiconductor material do not require any liquid or gas as coolant, and thus having advantages of being capable of working continuously, no contamination, no moving parts, no noises, long service life, small volume, and light weight, etc., so the thermoelectric device is widely applied on cooling or heating devices.

Generally, the thermoelectric device includes a plurality of N-type semiconductor members and P-type semiconductor members arranged in order. Then, the solder is used to joint the N-type semiconductor members and the P-type semiconductor members on a metal electrode. The N-type semiconductor members and the P-type semiconductor members are alternatively connected on the metal electrode from the upper side and the lower side, and they are connected in series to form a complete circuit. The metal electrodes on the upper side and the lower side are respectively connected onto the substrate after being processed by the electroplating process. The substrate is used to contact with a heat source, so the substrate must have desirable electrical insulation property and heat transfer property, and the material is generally ceramic or silicon.

When a power source is connected between the electrodes on two ends of the thermoelectric device, and the current flows from the N-type semiconductor member to the P-type semiconductor member, such that the thermal absorption occurs on one side of the thermoelectric device, and heat release occurs on the other side. At this time, if the connection direction of the power source is arranged inversely, the directions of the thermal absorption and the thermal release are changed. Therefore, the thermoelectric device can be used for the cooling device or heating device by this phenomenon.

However, the conventional thermoelectric device takes ceramic or silicon as the substrate. The ceramic substrate or silicon substrate does not have flexibility, so it cannot be applied on the heat source with a curved surface or changeable surface.

SUMMARY OF THE INVENTION

Accordingly, the present invention is directed to a flexible thermoelectric device. Buffer structures are formed on substrates, so as to offer flexible and tensile properties to the thermoelectric device. Meanwhile, a thermal transfer enhancement structure is formed on the flexible substrate, so as to overcome disadvantages of the conventional thermoelectric device such as low thermal transfer property, large volume, fixed device layout structure, and limited application fields, etc.

The present invention provides a method for manufacturing a flexible thermoelectric device. The substrates are produced by performing press molding process, so buffer structures are formed while the substrates are produced, and thus the manufacturing process is relatively simple.

The present invention provides a flexible thermoelectric device, which includes a first substrate, a second substrate, a plurality of thermoelectric pairs, a plurality of first electrodes, and a plurality of second electrodes. At least one of the first substrate and the second substrate has flexibility. The plurality of thermoelectric pairs is disposed between the first substrate and the second substrate. Each thermoelectric pair is respectively composed of a first type thermoelectric member and a second type thermoelectric member. The plurality of first electrodes is disposed between the first substrate and the thermoelectric pairs. The plurality of second electrodes is disposed between the second substrate and the thermoelectric pairs. The first type thermoelectric member and the second type thermoelectric member of each thermoelectric pair are alternatively connected in series by the first electrodes and the second electrodes.

The present invention provides a method for manufacturing a flexible thermoelectric device, which includes the following steps. Firstly, a first substrate and a second substrate are provided. At least one of the first substrate and the second substrate has a plurality of buffer structures. Next, a plurality of first electrodes is formed on the first substrate, and a plurality of second electrodes is formed on the second substrate. A plurality of thermoelectric pairs is formed on the first electrodes, and each thermoelectric pair is respectively composed of a first type thermoelectric member and a second type thermoelectric member. Then, the second electrodes and the thermoelectric pairs are jointed, and the first type thermoelectric member and the second type thermoelectric member of each thermoelectric pair are alternatively connected with each other in series by the first electrodes and the second electrodes.

In the flexible thermoelectric device of the present invention, buffer structures (concave structures, for example, a V-shaped groove, a square groove; convex structures, for example, a square, an inverted V-shaped, or a semicircular structure; and trenches) are disposed on at least one of the first substrate and the second substrate, which can be deformed along the substrate direction when the thermoelectric device substrate is warped or stretched. The concave structures or the convex structures can enlarge the heat transfer areas, and together with the thermal diffusion layers, the heat dissipation speed is increased.

Furthermore, thermal vias are disposed on at least one of the first substrate and the second substrate, such that the heat dissipation speed is increased.

In the method for manufacturing the flexible thermoelectric device of the present invention, the first substrate and the second substrate are produced by performing the pressing molding process, the buffer structures (including concave structures, for example, a V-shaped groove and a square groove; convex structures, for example, a square, an inverted V-shaped, or a semicircular structure; trenches; through holes; or bind holes) can be formed while the first substrate and the second substrate are produced, so the manufacturing process is relatively simple. The buffer structures can be deformed along the substrate direction when the thermoelectric device substrate is warped or stretched. The through holes or the blind holes on the first substrate and the second substrate can be used as the thermal vias, so as to enlarge the heat transfer area and to increase the heat dissipation speed.

In order to make the aforementioned and other objects, features, and advantages of the present invention comprehensible, preferred embodiments accompanied with figures are described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 2B to 2F show other variations of the flexible thermoelectric device according to the second embodiment of the present invention.

DESCRIPTION OF EMBODIMENTS

First Embodiment

Figure 1A:
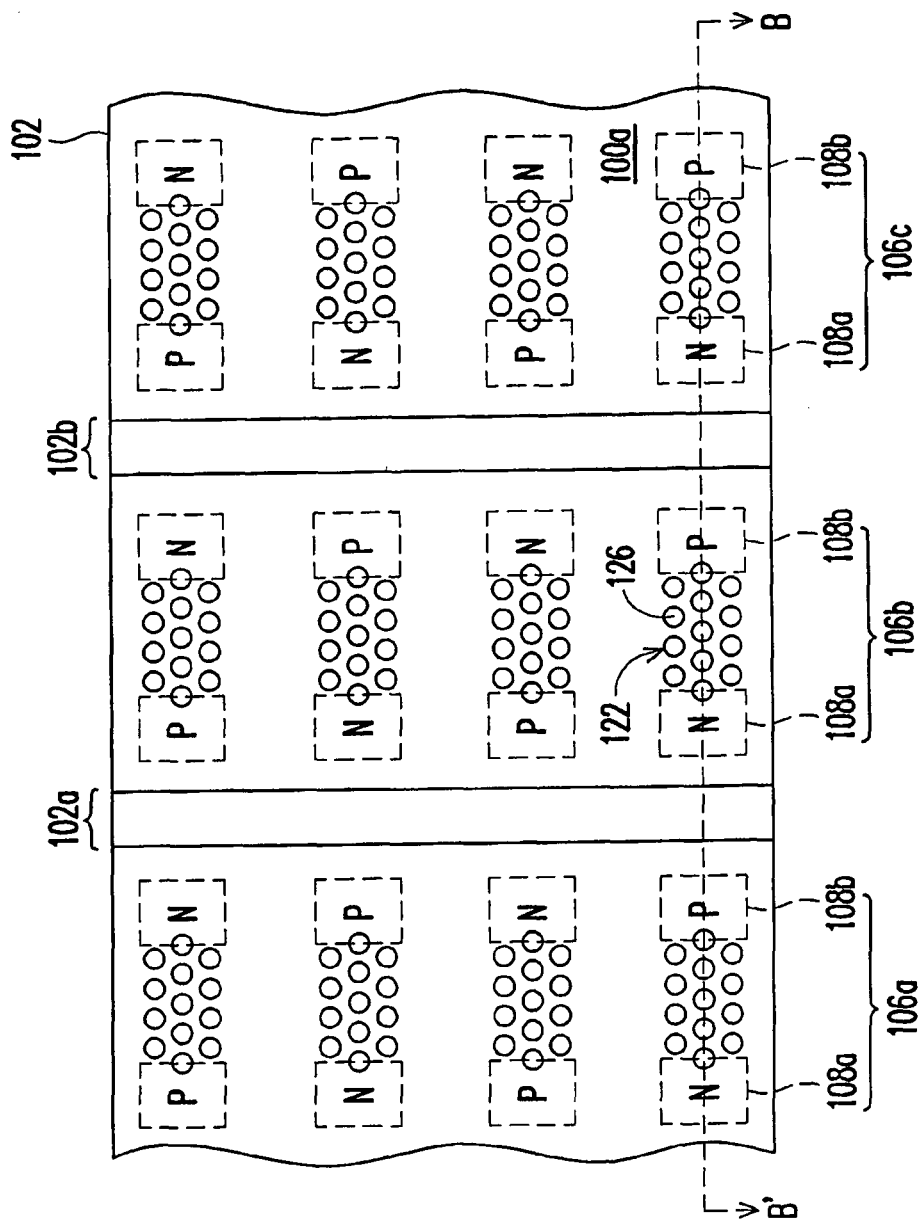
FIG. 1A is a top view of a flexible thermoelectric device according to a first embodiment of the present invention.
Figure 1B:
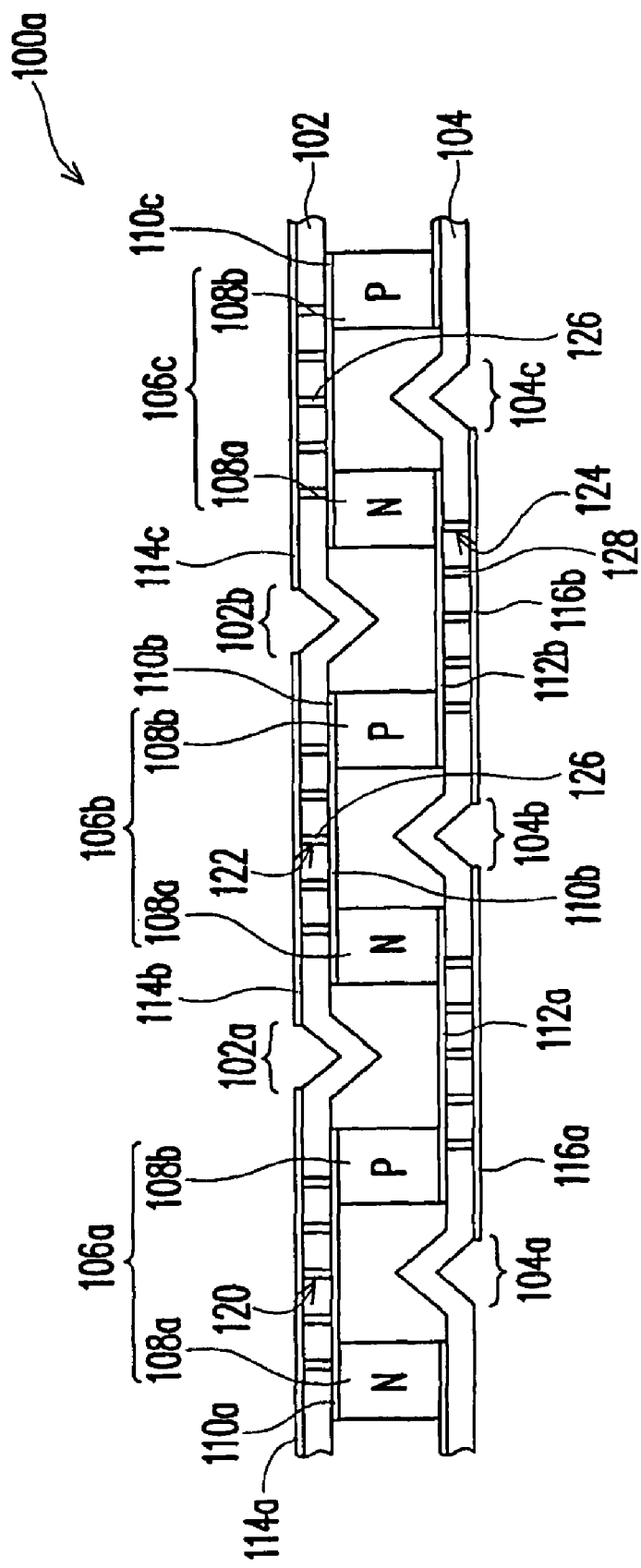
FIG. 1B is a sectional view of the flexible thermoelectric device taken along a line A-A' of FIG. 1A.

FIG. 1A is a top view of a flexible thermoelectric device according to a first embodiment of the present invention, and FIG. 1B is a sectional view of the flexible thermoelectric device taken along a line A-A' of FIG. 1A.

Referring to FIGS. 1A and 1B, a flexible thermoelectric device 100a includes a first substrate 102, a second substrate 104, a plurality of thermoelectric pairs 106a-106c, a plurality of first electrodes 110a-110c, and a plurality of second electrodes 112a-112b. Each of the thermoelectric pairs 106a-106c is respectively composed of an N-type thermoelectric member 108a and a P-type thermoelectric member 108b. The N-type thermoelectric members 108a and the P-type thermoelectric members 108b are, for example, arranged alternatively with each other, that is, two adjacent thermoelectric members may have different configurations.

The first substrate 102 and the second substrate 104 are for example respectively formed with a plurality of buffer structures 102a-102b and 104a-104c, so as to make the first substrate 102 and the second substrate 104 have flexibility. The first substrate 102 and the second substrate 104 are made of polymer material, for example, polymethacrylate (PMMA), polydimethylsiloxane (PDMS), or polyimide (PI), etc. . . .

The buffer structures 102a-102b on the first substrate 102 are, for example, disposed on corresponding positions between the N-type thermoelectric member 108a and the P-type thermoelectric member 108b of the adjacent thermoelectric pairs 106a-106c. For example, the buffer structure 102a is disposed between the P-type thermoelectric member 108b of the thermoelectric pair 106a and the N-type thermoelectric member 108a of the thermoelectric pair 106b. The buffer structure 102b is disposed between the P-type thermoelectric member 108b of the thermoelectric pair 106b and the N-type thermoelectric member 108a of the thermoelectric pair 106c.

The buffer structures 104a-104c on the second substrate 104 are, for example, disposed on corresponding positions between the N-type thermoelectric member 108a and the P-type thermoelectric member 108b of each of the thermoelectric pairs 106a-106c. For example, the buffer structure 104a is disposed between the N-type thermoelectric member 108a and the P-type thermoelectric member 108b of the thermoelectric pair 106a. The buffer structure 104b is disposed between the N-type thermoelectric member 108a and the P-type thermoelectric member 108b of the thermoelectric pair 106b. The buffer structure 104c is disposed between the N-type thermoelectric member 108a and the P-type thermoelectric member 108b of the thermoelectric pair 106c.

In this embodiment, the buffer structures 102a-102b and 104a-104c of the first substrate 102 and the second substrate 104 include concave structures. The buffer structures 102a-102b can also be formed by one or more concave structures. The concave structure is, for example, a V-shaped groove. Definitely, the concave structure can also be a square groove or a semicircular groove, etc.

The plurality of thermoelectric pairs 106a-106c is, for example, disposed between the first substrate 102 and the second substrate 104. The N-type thermoelectric member 108a and the P-type thermoelectric member 108b can be in the form of a thin film, a thick film, or a bulk material. The N-type thermoelectric member 108a and the P-type thermoelectric member 108b are made of a semiconductor material, for example, Bi—Te compound, Fe—Si compound, or Co—Sb compound etc.

The plurality of first electrodes 110a-110c is, for example, disposed between the first substrate 102 and the thermoelectric pairs 106a-106c. Each of the first electrodes 110a-110c is respectively connected to the N-type thermoelectric member 108a and the P-type thermoelectric member 108b of each of the thermoelectric pairs 106a-106c. For example, the first electrode 110a is connected to the N-type thermoelectric member 108a and the P-type thermoelectric member 108b of the thermoelectric pair 106a. The first electrode 110b is connected to the N-type thermoelectric member 108a and the P-type thermoelectric member 108b of the thermoelectric pair 106b. The first electrode 110c is connected to the N-type thermoelectric member 108a and the P-type thermoelectric member 108b of the thermoelectric pair 106c.

The plurality of second electrodes 112a-112c is, for example, disposed between the second substrate 104 and the thermoelectric pairs 106a-106c. Each of the second electrodes 112a-112b is respectively connected to the N-type thermoelectric member 108a and the P-type thermoelectric member 108b of the adjacent thermoelectric pairs 106a-106c. For example, the second electrode 112a is connected between the P-type thermoelectric member 108b of the thermoelectric pair 106a and the N-type thermoelectric member 108a of the thermoelectric pair 106b. The second electrode 112b is connected between the P-type thermoelectric member 108b of the thermoelectric pair 106b and the N-type thermoelectric member 108a of the thermoelectric pair 106c. The N-type thermoelectric member 108a and the P-type thermoelectric member 108b of each of the thermoelectric pairs 106a-106c are alternatively connected to each other in series by the first electrodes 110a-110c and the second electrodes 112a-112b.

In addition, the flexible thermoelectric device 100a can be selectively disposed with a plurality of thermal diffusion layers 114a-114c and 116a-116b. The plurality of thermal diffusion layers 114a-114c and 116a-116b are, for example, respectively disposed on an external surface of the first substrate 102 and the second substrate 104. The thermal diffusion layers 114a-114c and 116a-116b can completely or partially cover the external surfaces of the first substrate 102 and the second substrate 104. In the present invention, the external surface of the first substrate 102 refers to a back surface of the surface where the first electrodes of the first substrate 102 are disposed thereon, and the external surface of the second substrate 104 refers to a back surface of the surface where the second electrodes of the second substrate 104 are disposed thereon. The thermal diffusion layer is made of, for example, a metal material.

The flexible thermoelectric device 100a can selectively dispose a plurality of through holes 122 and through holes 124 in the first substrate 102 and the second substrate 104. Thermal vias 126 and thermal vias 128 are respectively formed in the through holes 122 and the through holes 124.

The plurality of through holes 122 in the first substrate 102 is located between the N-type thermoelectric member 108a and the P-type thermoelectric member 108b of each of the thermoelectric pairs 106a-106c. The plurality of thermal diffusion layers 114a-114c is, for example, disposed on the external surface of the first substrate 102, and respectively located on corresponding positions between the N-type thermoelectric member 108a and the P-type thermoelectric member of each of the thermoelectric pairs 106a-106c. The plurality of thermal vias 126 is, for example, disposed in the through holes 122, for respectively connecting the first electrodes 110a-110c to the thermal diffusion layers 114a-114c. For example, the first electrode 110a and the thermal diffusion layer 114a are connected together by the thermal via 126. The first electrode 110b and the thermal diffusion layer 114b are connected together by the thermal via 126. The first electrode 110c and the thermal diffusion layer 114c are connected together by the thermal via 126. The thermal diffusion layers 114a-114c are electrically isolated from each other, so as to prevent the short circuit of the thermoelectric device.

The plurality of through holes 124 in the second substrate 104 is located between the N-type thermoelectric member 108a and the P-type thermoelectric member 108b of the adjacent thermoelectric pairs 106a-106c. The plurality of thermal diffusion layers 116a-116b is, for example, disposed on the external surface of the second substrate 104, and respectively located on corresponding positions between the N-type thermoelectric member 108a and the P-type thermoelectric member of each of the adjacent thermoelectric pairs 106a-106c. The plurality of thermal vias 128 is, for example, disposed in the through holes 124, for respectively connecting the second electrodes 112a-112b to the thermal diffusion layers 116a-116b. For example, the second electrode 112a and the thermal diffusion layer 116a are connected together by the thermal via 128. The second electrode 112b and the thermal diffusion layer 116b are connected together by the thermal via 128. The thermal diffusion layers 116a-116c are electrically isolated from each other, so as to prevent the short circuit of the thermoelectric device.

In the flexible thermoelectric device of the first embodiment, the concave structure, for example, the V-shaped groove or the square groove is disposed on the first substrate and the second substrate to serve as a stress buffer structure for the substrate, such that when the thermoelectric device substrate is warped or stretched, it can be deformed along the substrate direction. The concave structure can enlarge the heat transfer area, and together with the thermal diffusion layers, the heat dissipation speed is increased.

In the flexible thermoelectric device of the first embodiment, the thermal vias are disposed on the first substrate and the second substrate, so as to increase the heat dissipation speed. In this embodiment, the thermal vias 126 and the thermal vias 128 for filling up the through holes 122 and the through holes 124 are taken as an example for illustration. Definitely, the thermal vias 126 and the thermal vias 128 may also not fill up the through holes 122 and the through holes 124, but merely cover the surfaces and side walls of the through holes, and the objective of increasing the heat dissipation speed can also be achieved similarly.

In addition, in another embodiment, blind holes can also be used to replace the through holes. The blind holes are disposed on an external surface of at least one of the first substrate and the second substrate. Furthermore, the blind holes can enlarge the heat transfer area, and together with the thermal diffusion layers, the heat dissipation speed is increased.

Second Embodiment

Figure 2A:
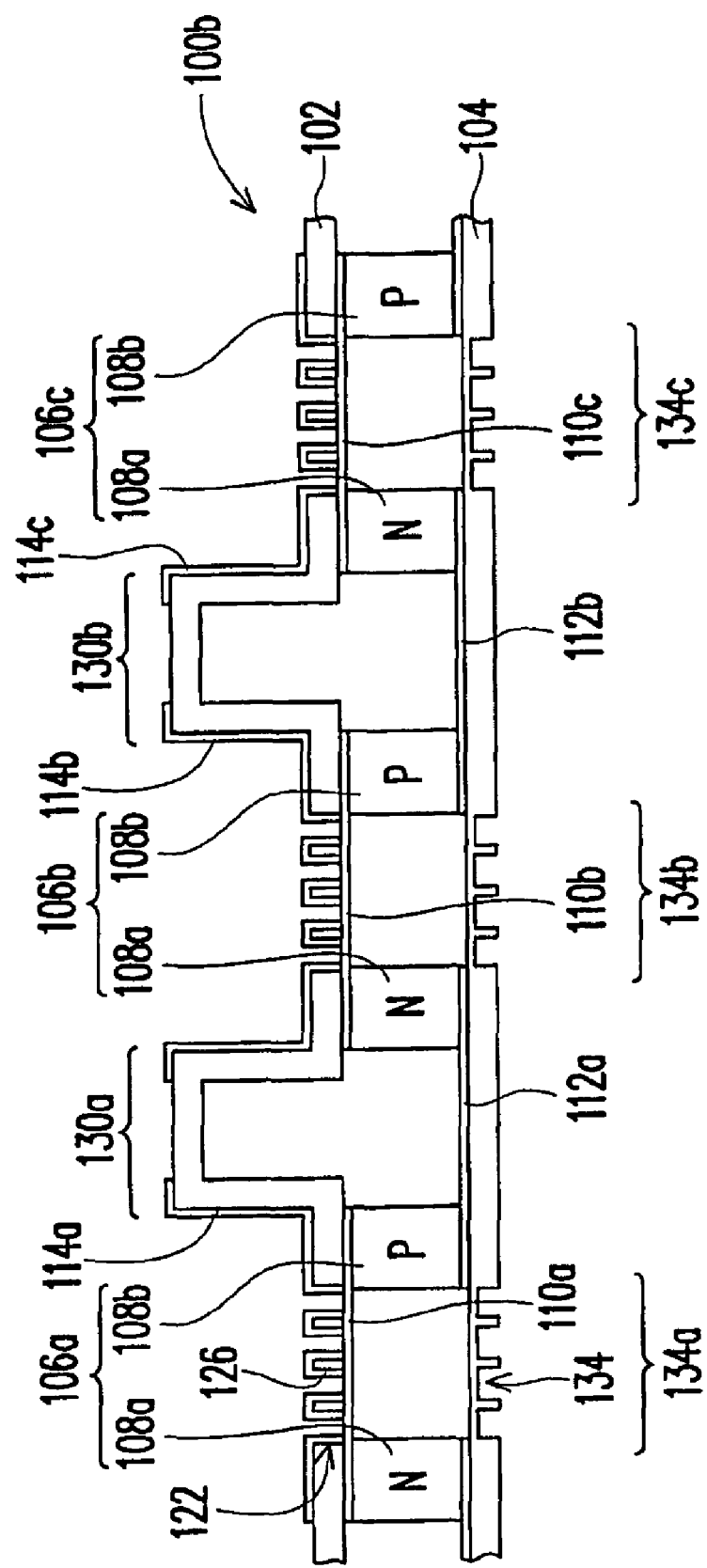
FIG. 2A is a sectional view of a flexible thermoelectric device according to a second embodiment of the present invention.

FIG. 2A is a sectional view of a flexible thermoelectric device according to a second embodiment of the present invention, and FIGS. 2B to 2F show other variations of the flexible thermoelectric device according to the second embodiment of the present invention. In FIGS. 2A to 2E, the same numerals are used to indicate the members the same as that of the first embodiment, and the illustrations are omitted here. In order to simplify the drawings, in FIGS. 2B to 2F, the plurality of thermoelectric pairs 106a-106c is collectively called the thermoelectric pair 106, the plurality of first electrodes 116a-116c is collectively called the first electrode 110, and the plurality of second electrodes 112a-112b is collectively called the second electrode 112. The difference between this embodiment and the first embodiment lies in that, the second substrate 104 is a flat plate, and a convex structure is disposed on the first substrate 102 to serve as buffer structures 130a and 130b.

As shown in FIG. 2A, a flexible thermoelectric device 100b is, for example, formed by a first substrate 102, a second substrate 104, a plurality of thermoelectric pairs 106a-106c, a plurality of first electrodes 110a-110c, and a plurality of second electrodes 112a-112b.

Figure 2B:
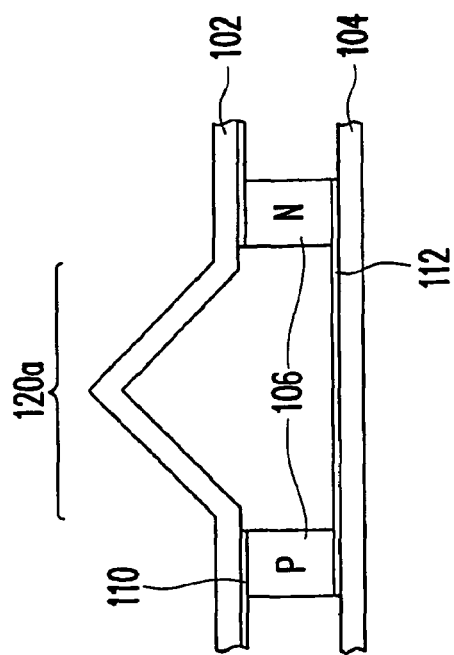
Figure 2C:
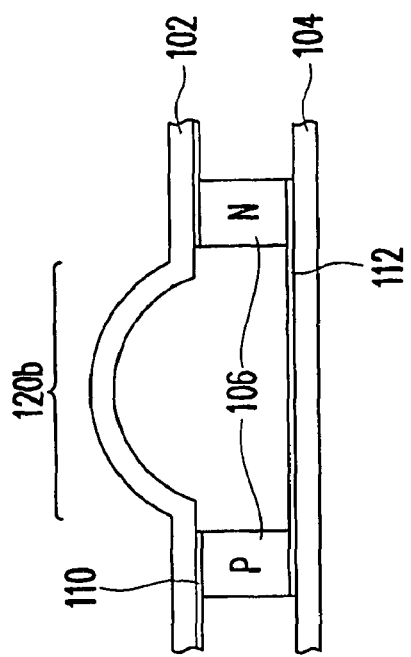
Figure 2F:
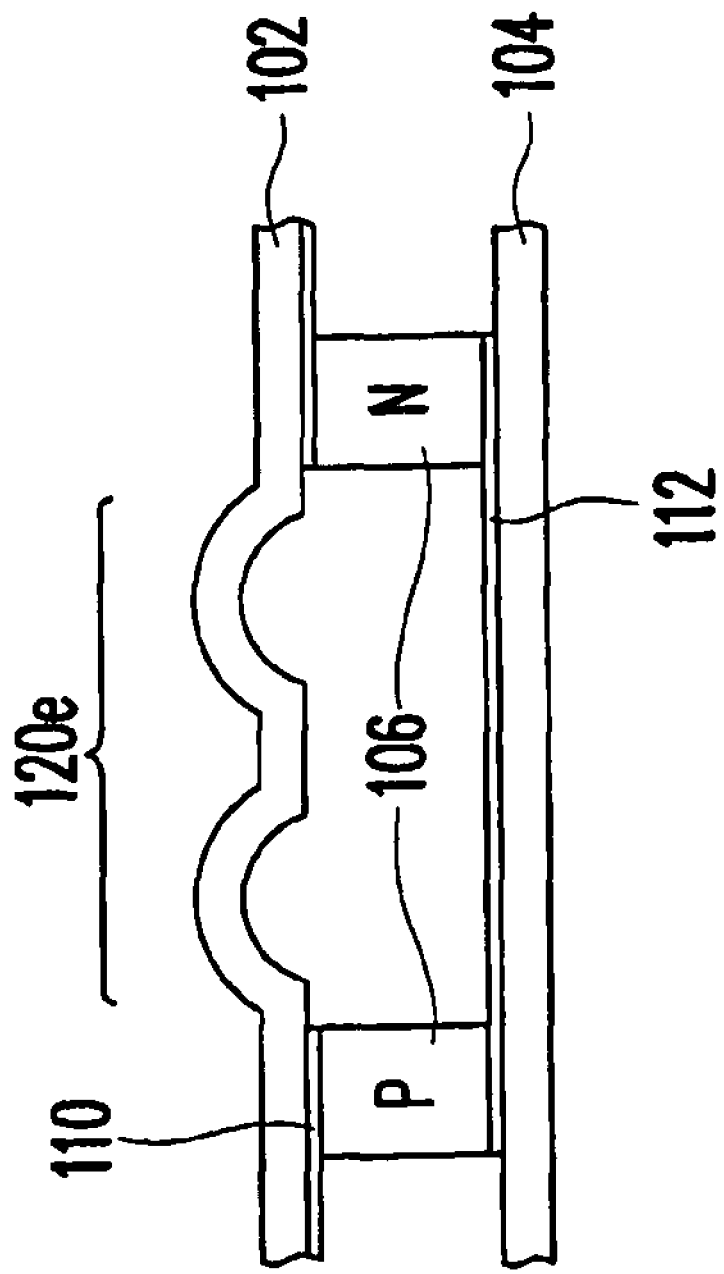

The buffer structures 130a and 130b of the first substrate 102 include a convex structure, for example, a square protrusion. Definitely, the buffer structure 120 of the first substrate 102 can also be convex structure in other configurations. For example, the first substrate 102 can have a buffer structure 120a of an inverted V-shaped protrusion (as shown in FIG. 2B) or a buffer structure 120b of a semicircular protrusion (as shown in FIG. 2C). The buffer structure 120 of the first substrate 102 can also be formed by one or more convex structures. For example, the first substrate 102 can also include a buffer structure 120c having two square protrusions (as shown in FIG. 2D), a buffer structure 120d having two inverted V-shaped protrusions (as shown in FIG. 2E), or a buffer structure 120e having two semicircular protrusions (as shown in FIG. 2F).

As shown in FIG. 2A, in the flexible thermoelectric device 100b, the thermal diffusion layers 114a-114c and 116a-116c are selectively disposed on the external surface of the first substrate 102 or the second substrate 104 respectively. The thermal diffusion layers 114a-114c and 116a-116c can completely or partially cover the external surface of the first substrate 102 or the second substrate 104. The first substrate 102 is a substrate having the convex structure, such that the heat transfer area is increased. The thermal diffusion layers 114a-114c further enable the convex structure of the first substrate 102 to have the functions of a heat sink fin.

In the flexible thermoelectric device 100b, a plurality of through holes 122 and through holes 124 is selectively disposed in the first substrate 102 and the second substrate 104 respectively. Thermal vias 126 and thermal vias 128 are respectively formed in the through holes 122 and the through holes 124.

The plurality of through holes 122 in the first substrate 102 is located between the N-type thermoelectric member 108a and the P-type thermoelectric member 108b of each of the thermoelectric pairs 106a-106c. The plurality of thermal diffusion layers 114a-114c is, for example, disposed on the external surface of the first substrate 102, and respectively located on corresponding positions between the N-type thermoelectric member 108a and the P-type thermoelectric member of each of the thermoelectric pairs 106a-106c. The plurality of thermal vias 126 is, for example, disposed in the through holes 122, for respectively connecting the first electrodes 110a-110c to the thermal diffusion layers 114a-114c. For example, the first electrode 110a and the thermal diffusion layer 114a are connected together by the thermal via 126. The first electrode 110b and the thermal diffusion layer 114b are connected together by the thermal via 126. The first electrode 110c and the thermal diffusion layer 114c are connected together by the thermal via 126. The thermal vias 126 do not fill up the through holes 122, but only cover the surfaces and the side walls of the through holes 122. The thermal diffusion layers 114a-114c are electrically isolated from each other, so as to prevent the short circuit of the thermoelectric device. In this embodiment, the thermal diffusion layers 114a-114c are broken from the top of the buffer structures 130a and 130b of the square protrusion. In addition, the thermal diffusion layers 114a-114c and the thermal vias 126 can be manufactured by the same process, that is, the thermal diffusion layers 114a-114c and the thermal vias 126 can be integrated as a whole.

The plurality of through holes 124 in the second substrate 104 is located between the N-type thermoelectric member 108a and the P-type thermoelectric member 108b of the adjacent thermoelectric pairs 106a-106c. The plurality of thermal diffusion layers 116a-116b is, for example, disposed on the external surface of the second substrate 104, and respectively located on corresponding positions between the N-type thermoelectric member 108a and the P-type thermoelectric member of each of the adjacent thermoelectric pairs 106a-106c. The plurality of thermal vias 128 is, for example, disposed in the through holes 124, for respectively connecting the second electrodes 112a-112b to the thermal diffusion layers 116a-116b. For example, the second electrode 112a and the thermal diffusion layer 116a are connected together by the thermal via 128. The second electrode 112b and the thermal diffusion layer 116b are connected together by the thermal via 128. The thermal vias 128 do not fill up the through holes 124, but merely cover the surfaces and the side walls of the through holes 124. The thermal diffusion layers 116a-116b are electrically isolated from each other, so as to prevent the short circuit of the thermoelectric device. In addition, the thermal diffusion layers 116a-116c and the thermal vias 128 can be manufactured by the same process, that is, the thermal diffusion layers 116a-116c and the thermal vias 128 are integrated as a whole.

In addition, in this embodiment, a plurality of trenches 134 may be selectively disposed on the external surface of the second substrate 104 in parallel to serve as the buffer structures 134a-134c. The buffer structures 134a-134c are, for example, disposed between the N-type thermoelectric member 108a and the P-type thermoelectric member 108b of each of the thermoelectric pairs 106a-106c. For example, the buffer structure 134a is disposed between the N-type thermoelectric member 108a and the P-type thermoelectric member 108b of the thermoelectric pair 106a. The buffer structure 134b is disposed between the N-type thermoelectric member 108a and the P-type thermoelectric member 108b of the thermoelectric pair 106b. The buffer structure 134c is disposed between the N-type thermoelectric member 108a and the P-type thermoelectric member 108b of the thermoelectric pair 106c.

In the flexible thermoelectric device of this embodiment, the thermal vias are disposed on the first substrate and the second substrate, so as to increase the heat dissipation speed. In this embodiment, the thermal vias 126 and the thermal vias 128 do not fill up the through holes 122 and the through holes 124, but merely cover the surfaces and the side walls of the through holes, so as to enlarge the heat dissipation area. The first substrate 102 has a convex structure, such that the heat transfer area is increased. The thermal diffusion layers further enable the convex structure of the first substrate 102 to have the functions of a heat sink fin.

In the flexible thermoelectric device of this embodiment, a plurality of trenches at least extending along a Y direction is disposed on the second substrate to serve as stress buffer structures, which can be at least deformed along an X direction when the thermoelectric device substrate is warped or stretched. In addition, a plurality of trenches extending along the X direction can also be disposed on the second substrate to serve as the stress buffer structures, which can be deformed along the X direction and the Y direction when the thermoelectric device substrate is warped or stretched.

Third Embodiment

Figure 3A:
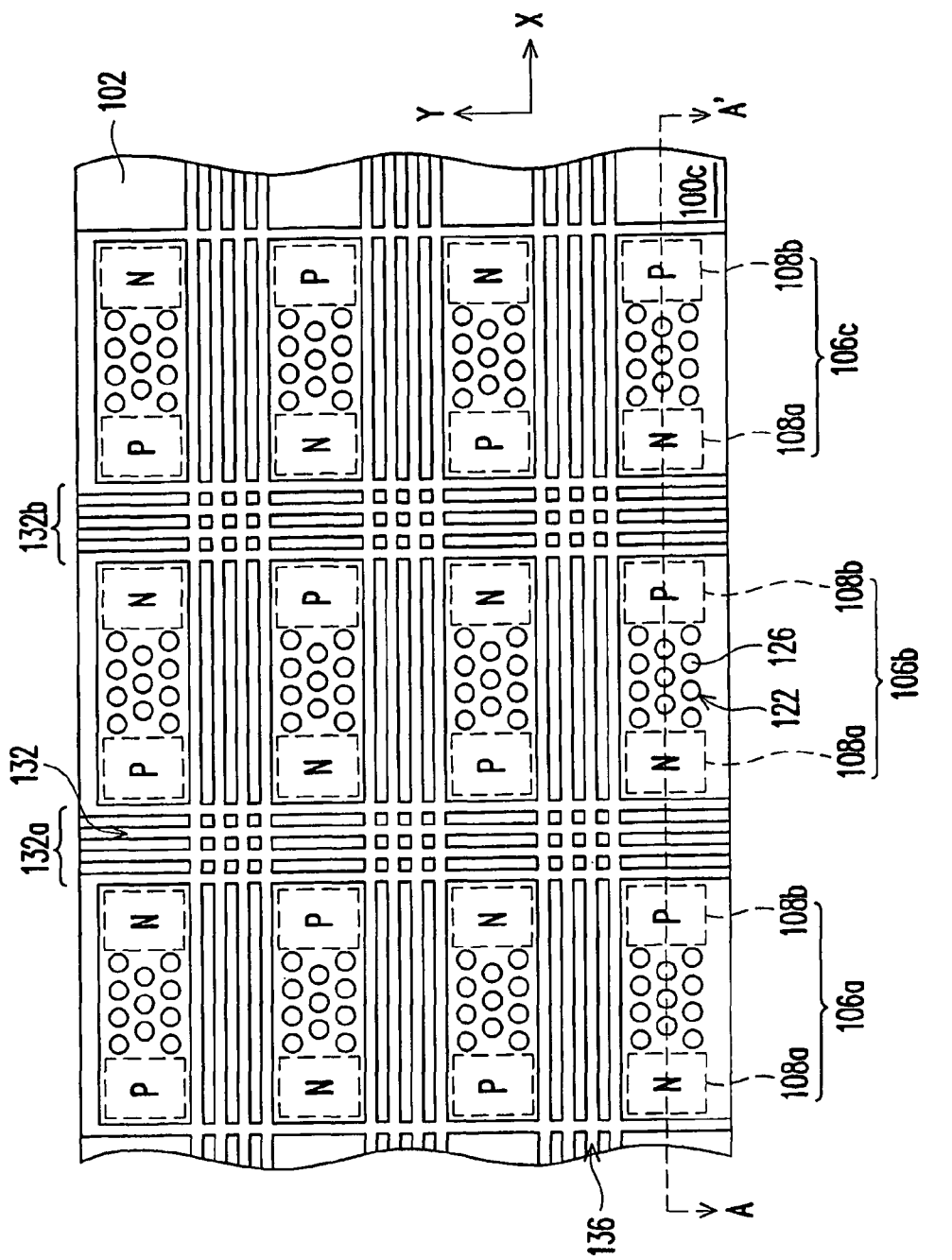
FIG. 3A is a top view of a flexible thermoelectric device according to a third embodiment of the present invention.
Figure 3B:
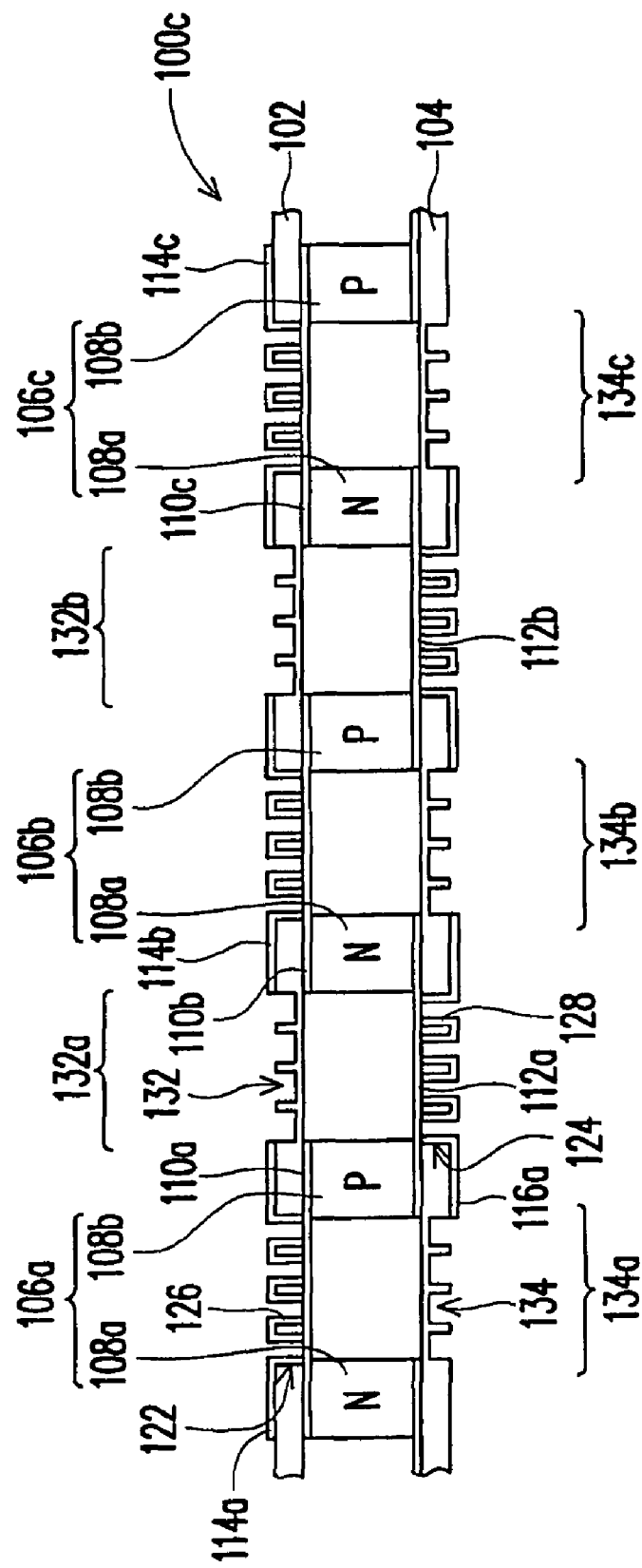
FIG. 3B is a sectional view of the flexible thermoelectric device taken along the line A-A' of FIG. 3A.

FIG. 3A is a top view of a flexible thermoelectric device according to a third embodiment of the present invention, and FIG. 3B is a sectional view of the flexible thermoelectric device taken along the line A-A' of FIG. 3A. In FIGS. 3A and 3B, the same numerals are given to indicate members the same as that of the first embodiment, and the illustrations are omitted here. The difference between this embodiment and the first embodiment lies in that, the first substrate 102 and the second substrate 104 are both flat plates, and a plurality of trenches 132 and 134 arranged in parallel is respectively disposed on the external surfaces of the first substrate 102 and the second substrate 104 to serve as buffer structures 132a-132b and 134a-134c.

Referring to FIGS. 3A and 3B, the flexible thermoelectric device 100c is, for example, formed by a first substrate 102, a second substrate 104, a plurality of thermoelectric pairs 106a-106c, a plurality of first electrodes 110a-110c, and a plurality of second electrodes 112a-112b.

The buffer structures 132a-132b of the first substrate 102 are formed by a plurality of trenches 132. The buffer structures 132a-132b are located between the N-type thermoelectric member 108a and the P-type thermoelectric member 108b of the adjacent thermoelectric pairs 106a-106c. For example, the buffer structure 132a is disposed between the P-type thermoelectric member 108b of the thermoelectric pair 106a and the N-type thermoelectric member 108a of the thermoelectric pair 106b. The buffer structure 132b is disposed between the P-type thermoelectric member 108b of the thermoelectric pair 106b and the N-type thermoelectric member 108a of the thermoelectric pair 106c.

The buffer structures 134a-134c of the second substrate 104 are formed by a plurality of trenches 134. The buffer structures 134a-134c are, for example, located between the N-type thermoelectric member 108a and the P-type thermoelectric member 108b of each of the thermoelectric pairs 106a-106c. For example, the buffer structure 134a is disposed between the N-type thermoelectric member 108a and the P-type thermoelectric member 108b of the thermoelectric pair 106a. The buffer structure 134b is disposed between the N-type thermoelectric member 108a and the P-type thermoelectric member 108b of the thermoelectric pair 106b. The buffer structure 134c is disposed between the N-type thermoelectric member 108a and the P-type thermoelectric member 108b of the thermoelectric pair 106c.

As shown in FIG. 3A, the plurality of trenches 132 and 134 extends along the Y direction. The trenches 132 and 134 are respectively used as the stress buffer structures for the first substrate 102 and the second substrate 104, which can be deformed along the X direction when the thermoelectric device substrate is warped or stretched. In addition, as shown in FIG. 5A, the thermoelectric device of this embodiment can selectively dispose a plurality of trenches 136 extending along the X direction on the first substrate 102 and the second substrate 104. The plurality of trenches 136 is located between the adjacent thermoelectric pairs, and the X direction and the Y direction are crossed with each other. The trenches 136 are similarly used as the stress buffer structures for the first substrate 102 and the second substrate 104, which can be deformed along the Y direction when the thermoelectric device substrate is warped or stretched.

In addition, the first substrate 102 and the second substrate 104 can be selectively disposed with a plurality of through holes 122 and through holes 124. Thermal vias 126 and thermal vias 128 are respectively formed in the through holes 122 and the through holes 124.

The plurality of through holes 122 in the first substrate 102 is located between the N-type thermoelectric member 108a and the P-type thermoelectric member 108b of each of the thermoelectric pairs 106a-106c. The plurality of thermal diffusion layers 114a-114c is, for example, disposed on the external surface of the first substrate 102, and respectively located on corresponding positions between the N-type thermoelectric member 108a and the P-type thermoelectric member of each of the thermoelectric pairs 106a-106c. The plurality of thermal vias 126 is, for example, disposed in the through holes 122, for respectively connecting the first electrodes 110a-110c to the thermal diffusion layers 114a-114c. For example, the first electrode 110a and the thermal diffusion layer 114a are connected together by the thermal via 126. The first electrode 110b and the thermal diffusion layer 114b are connected together by the thermal via 126. The first electrode 110c and the thermal diffusion layer 114c are connected together by the thermal via 126. The thermal vias 126 do not fill up the through holes 122, but merely cover the surfaces and the side walls of the through holes 122. The thermal diffusion layers 114a-114c are electrically isolated from each other, so as to prevent the short circuit of the thermoelectric device.

The plurality of through holes 124 in the second substrate 104 is located between the N-type thermoelectric member 108a and the P-type thermoelectric member 108b of the adjacent thermoelectric pairs 106a-106c. The plurality of thermal diffusion layers 116a-116b is, for example, disposed on the external surface of the second substrate 104, and respectively located on corresponding positions between the N-type thermoelectric member 108a and the P-type thermoelectric member of each of the adjacent thermoelectric pairs 106a-106c. The plurality of thermal vias 128 is, for example, disposed in the through holes 124, for respectively connecting the second electrodes 112a-112b to the thermal diffusion layers 116a-116b. For example, the second electrode 112a and the thermal diffusion layer 116a are connected together by the thermal via 128. The second electrode 112b and the thermal diffusion layer 116b are connected together by the thermal via 128. The thermal vias 128 do not fill up the through holes 124, but only cover the surfaces and the side walls of the through holes 124. The thermal diffusion layers 116a-116b are electrically isolated from each other, so as to prevent the short circuit of the thermoelectric device.

In the flexible thermoelectric device in this embodiment, a plurality of trenches at least extending along the Y direction is disposed on at least one of the first substrate and the second substrate to serve as the stress buffer structures, which can be at least deformed along the X direction when the thermoelectric device substrate is warped or stretched. A plurality of trenches 136 extending along the X direction can also be disposed on the first substrate and the second substrate to serve as the stress buffer structures, which can be at least deformed along the X direction and the Y direction when the thermoelectric device substrate is warped or stretched.

In the flexible thermoelectric device of this embodiment, the thermal vias are disposed on the first substrate and the second substrate, so as to increase the heat dissipation speed.

In addition, the flexible thermoelectric device of the present invention is not limited to the configurations in the first to third embodiments, but also can be any combination of the configurations in the first embodiment to the third embodiment. For example, the first substrate (or the second substrate) can be selected from the above substrates using any one of the concave structure, the convex structure, and the trench as the buffer structure, and the second substrate (or the first substrate) can be selected from the above substrates using any one of the concave structure, the convex structure, and the trench as the buffer structure or selected from flat plate substrates without buffer structures. The through holes and the blind holes can also be selectively disposed on the first substrate or the second substrate to serve as the thermal vias, so as to increase the heat dissipation speed.

Figure 4:
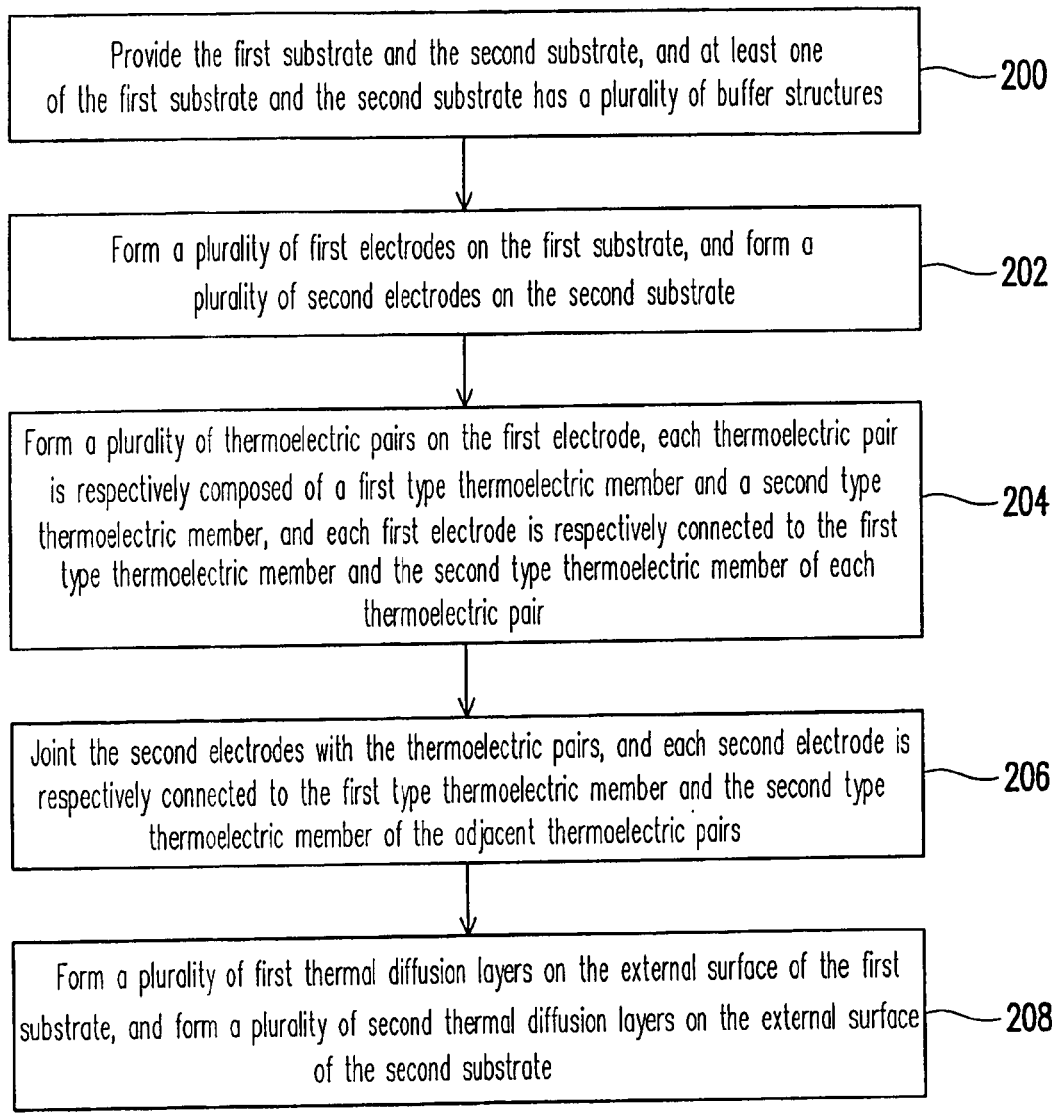
FIG. 4 is a flow chart of an embodiment of a method for manufacturing a flexible thermoelectric device of the present invention.

The structure of the flexible thermoelectric device is illustrated above, and then the method for manufacturing the flexible thermoelectric device of the present invention is illustrated below. FIG. 4 is a flow chart of an embodiment of a method for manufacturing a flexible thermoelectric device of the present invention.

Referring to FIG. 4, firstly, the first substrate and the second substrate are provided, and at least one of the first substrate and the second substrate has a plurality of buffer structures (Step 200). The first substrate and the second substrate having the plurality of buffer structures are produced by performing a press molding process. For example, firstly, a master mold of a substrate is produced by a semiconductor process, a LIGA process, and an electroforming process. Then, the first substrate and the second substrate are produced by selecting PMMA, PDMS, and PI, or other polymer molding materials, and by means of hot pressing or other manners such as exposure and curing.

If the buffer structures of the first substrate and the second substrate are concave structures (FIG. 1B) or convex structures (FIGS. 2A to 2F), the concave structures and the convex structures can be directly made by the master mold of the substrate. That is, the concave structure and the convex structure can be produced simultaneously during the press molding process of the first substrate and the second substrate.

If the buffer structures of the first substrate and the second substrate are trenches (FIGS. 2A, 3A, and 3B), the trenches can be directly formed by the master mold of the substrate.

That is, the trenches can be formed simultaneously during the press molding process of the first substrate and the second substrate. Alternatively, after the first substrate and the second substrate are molded, a cutting step is performed to the first substrate and the second substrate, so as form the trenches extending along the X direction and the Y direction (FIG. 3A). The cutting step is achieved by, for example, a laser cutting process or a conventional cutting process.

When the first substrate and the second substrate has at least one of the plurality of through holes and the plurality of blind holes (FIGS. 1A, 1B, 2A, 2B, 3A, and 3B), the plurality of through holes or the plurality of blind holes can be directly formed by the master mold of the substrate. That is, the through holes or the blind holes can be formed simultaneously during the press molding process of the first substrate and the second substrate. Alternatively, after the first substrate and the second substrate have been molded, a drilling step is performed on the first substrate and the second substrate, so as to form the plurality of through holes or the plurality of blind holes. The drilling step is achieved by, for example, a laser drilling process or a conventional drilling process.

Next, a plurality of first electrodes is formed on the first substrate, and a plurality of second electrodes is formed on the second substrate (Step 202). The process of forming the plurality of first electrodes and the plurality of second electrodes on the first substrate and the second substrate respectively includes, for example, a printed circuit board manufacturing process. Alternatively, the semiconductor process can also be adopted, for example, firstly, a metal layer is sputtered or deposited on the first substrate and the second substrate, and then a lithography and etching step is performed, so as to pattern the metal layer to form the plurality of first electrodes and the plurality of second electrodes.

Then, a plurality of thermoelectric pairs is formed on the first electrode. Each of the thermoelectric pairs is respectively formed by a first type thermoelectric member and a second type thermoelectric member, and each of the first electrodes is respectively connected to the first type thermoelectric member and the second type thermoelectric member of each of the thermoelectric pairs (Step 204). The first type thermoelectric member and the second type thermoelectric member can be in the form of a thin film, a thick film, and a bulk material. The first type thermoelectric member and the second type thermoelectric member are made of, for example, semiconductor materials doped by N-type dopant or P-type dopant. The first type thermoelectric member and the second type thermoelectric member are formed by sputtering, evaporation, metal-organic chemical vapor deposition (MOCVD), and molecular beam epitaxy (MBE) processes. The first type thermoelectric member and the second type thermoelectric member are, for example, formed on the first electrode by soldering.

Then, the second electrodes and the thermoelectric pairs are jointed, and each of the second electrodes is respectively connected to the first type thermoelectric member and the second type thermoelectric member of the adjacent thermoelectric pairs (Step 206). The second electrodes and the thermoelectric pairs are jointed by, for example, a soldering process.

Next, a plurality of first thermal diffusion layers is formed on an external surface of the first substrate, and a plurality of second thermal diffusion layers is formed on an external surface of the second substrate (Step 208). The first thermal diffusion layer and the second thermal diffusion layer are produced by a semiconductor process, for example, electroplating, sputtering, or printed circuit board manufacturing process.

In addition, if the first substrate and the second substrate have the plurality of through holes or blind holes thereon (FIGS. 1A, 1B, 2A, 2B, 3A, and 3B), before the first thermal diffusion layers and the second thermal diffusion layers are formed, the electroplating or sputtering process is used to apply the metal on inner walls of the through holes or the blind holes, or to completely fill up the through holes or the blind holes so as to form the thermal vias. After the first thermal diffusion layers and the second thermal diffusion layers are formed, a patterning process is performed, so as to make the first thermal diffusion layers be respectively located on corresponding positions between the first type thermoelectric member and the second type thermoelectric member of the adjacent thermoelectric pairs, and to make the second thermal diffusion layers be respectively located on corresponding position between the first type thermoelectric member and the second type thermoelectric member of each of the thermoelectric pairs. The first thermal diffusion layers are respectively connected to the first electrodes by the thermal via. The second thermal diffusion layers are respectively connected to the second electrodes by the thermal via.

In the method for manufacturing the flexible thermoelectric device of the present invention, the substrates (the first substrate and the second substrate) are produced by the press molding process, and the buffer structures (including the concave structures, for example, the V-shaped groove and the square groove etc.; the convex structures, for example, the square, the inverted V-shaped or the semicircular structures, etc.; the trenches; the through holes; or the blind holes) are formed while the substrates are produced, so the manufacturing process is relatively simple. The buffer structures can be deformed along the substrate direction when the thermoelectric device substrate is warped or stretched.

The through holes or the blind holes on the substrates (the first substrate and the second substrate) can be used as the thermal vias, so as to enlarge the heat transfer area, and to increase the heat dissipation speed.

To sum up, in the method for manufacturing the flexible thermoelectric device of the present invention, the concave structures, for example, a V-shaped groove and a square groove etc., the convex structures, for example, a square, an inverted V-shaped or a semicircular structure etc., and the trenches are disposed on the substrate to use as the stress buffer structure for the substrate, which can be deformed along the substrate direction when the thermoelectric device substrate is warped or stretched. The concave structures or the convex structures can enlarge the heat transfer area, and increase the heat dissipation speed.

The thermal vias are disposed on the substrates, so as to increase the heat dissipation speed.

In addition, in the method for manufacturing the flexible thermoelectric device of the present invention, the press molding manner is used to produce the substrate, so the buffer structures can be formed while the substrates are produced, so the manufacturing process is relatively simple.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A flexible thermoelectric device, comprising:
   a first substrate and a second substrate, wherein at least one of the first substrate and the second substrate has flexibility;

a plurality of thermoelectric pairs, disposed between the first substrate and the second substrate, wherein each of the thermoelectric pairs is composed of a first type thermoelectric member and a second type thermoelectric member;

a plurality of first electrodes, disposed between the first substrate and the thermoelectric pairs; and a plurality of second electrodes, disposed between the second substrate and the thermoelectric pairs, wherein the first type thermoelectric member and the second thermoelectric member of each of the thermoelectric pairs are alternatively connected with each other in series by the first electrodes and the second electrodes, wherein at least one of the first substrate and the second substrate has a plurality of buffer structures, and the buffer structures is deformed along the substrate direction when the thermoelectric device substrate is warped or stretched.

2. The flexible thermoelectric device as claimed in claim 1, wherein the first substrate and the second substrate are made of polymer material.

3. The flexible thermoelectric device as claimed in claim 1, wherein the first substrate and the second substrate are made of polymethacrylate (PMMA), polydimethylsiloxane (PDMS), or polyimide (PI).

4. The flexible thermoelectric device as claimed in claim 1, wherein the buffer structures of the first substrate are located on corresponding positions between the first type thermoelectric member and the second type thermoelectric member of the adjacent thermoelectric pairs.

5. The flexible thermoelectric device as claimed in claim 1, wherein the buffer structures of the second substrate are located on corresponding positions between the first type thermoelectric member and the second type thermoelectric member of each of the thermoelectric pairs.

6. The flexible thermoelectric device as claimed in claim 1, wherein each of the buffer structures comprises a concave structure or a convex structure.

7. The flexible thermoelectric device as claimed in claim 6, wherein the concave structure comprises a V-shaped groove, a square groove, or a semicircular groove; and the convex structure comprises a square protrusion, an inverted V-shaped protrusion, or a semicircular protrusion.

8. The flexible thermoelectric device as claimed in claim 6, wherein the number of the concave structures and the number of the convex structures are greater than or equal to one.

9. The flexible thermoelectric device as claimed in claim 1, wherein the buffer structures comprise a plurality of first trenches arranged in parallel, and the first trenches extend towards a first direction.

10. The flexible thermoelectric device as claimed in claim 9, further comprising a plurality of second trenches, arranged in parallel, and located on at least one of the first substrate and the second substrate between the adjacent the moelectric pairs, wherein the second trenches extend towards a second direction; and the first direction and the second direction are crossed with each other.

11. The flexible thermoelectric device as claimed in claim 1, wherein the first substrate has a plurality of first through holes, located on corresponding positions between the first type thermoelectric member and the second type thermoelectric member of each of the thermoelectric pairs.

12. The flexible thermoelectric device as claimed in claim 11, further comprising:

a plurality of first thermal diffusion layers, disposed on an external surface of the first substrate; and a plurality of first thermal vias, disposed in the first through holes, for connecting the first electrodes to the first diffusion layers.

13. The flexible thermoelectric device as claimed in claim 1, wherein the second substrate has a plurality of second through holes, located on corresponding positions between the first type thermoelectric member and the second type thermoelectric member of adjacent thermoelectric pairs.

14. The flexible thermoelectric device as claimed in claim 13, further comprising:

a plurality of second thermal diffusion layers, disposed on an external surface of the second substrate; and a plurality of second thermal vias, disposed in the second through holes, for connecting the second electrodes to the second diffusion layers.

15. The flexible thermoelectric device as claimed in claim 1, further comprising a plurality of thermal diffusion layers, disposed on an external surface of at least one of the first substrate and the second substrate.

16. The flexible thermoelectric device as claimed in claim 1, further comprising a plurality of blind holes, disposed on an external surface of at least one of the first substrate and the second substrate.

17. The flexible thermoelectric device as claimed in claim 16, further comprising a plurality of thermal diffusion layers, disposed on the external surface of at least one of the first substrate and the second substrate, for filling up or not filling up the blind holes.

18. The flexible thermoelectric device as claimed in claim 1, wherein the first type thermoelectric member and the second type thermoelectric member comprise a thin film, a thick film, or a bulk material.

* * * * *